(12) United States Patent
Volfovski et al.

(10) Patent No.: US 10,242,890 B2
(45) Date of Patent: Mar. 26, 2019

(54) SUBSTRATE SUPPORT WITH HEATER

(75) Inventors: Leon Volfovski, Mountain View, CA (US); Mayur G. Kulkarni, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 864 days.

(21) Appl. No.: 13/205,020

(22) Filed: Aug. 8, 2011

(65) Prior Publication Data
US 2013/0037532 A1 Feb. 14, 2013

(51) Int. Cl.
| | |
|---|---|
| *H05B 3/06* | (2006.01) |
| *H01L 21/67* | (2006.01) |
| *H01L 21/687* | (2006.01) |
| *H05B 3/14* | (2006.01) |
| *H05B 3/26* | (2006.01) |

(52) U.S. Cl.
CPC .... *H01L 21/67109* (2013.01); *H01L 21/6875* (2013.01); *H05B 3/145* (2013.01); *H05B 3/265* (2013.01); *H05B 2203/005* (2013.01); *H05B 2203/007* (2013.01); *H05B 2203/037* (2013.01)

(58) Field of Classification Search
CPC ........ H01L 21/67109; H01L 21/67103; H05B 3/00; C23C 16/4585
USPC ............ 219/390, 444.1, 385, 405, 411, 416; 118/728; 438/691
See application file for complete search history.

(56) References Cited

U.S. PATENT DOCUMENTS

| | | | |
|---|---|---|---|
| 5,326,725 A * | 7/1994 | Sherstinsky | C23C 16/042 118/500 |
| 5,511,608 A | 4/1996 | Boyd | |
| 5,834,737 A * | 11/1998 | Hirose et al. | 219/385 |
| 6,507,006 B1 * | 1/2003 | Hiramatsu et al. | 219/444.1 |
| 6,639,189 B2 * | 10/2003 | Ramanan et al. | 219/444.1 |
| 6,730,175 B2 * | 5/2004 | Yudovsky et al. | 118/728 |
| 6,753,507 B2 * | 6/2004 | Fure et al. | 219/444.1 |

(Continued)

FOREIGN PATENT DOCUMENTS

| | | |
|---|---|---|
| JP | 2002-237375 A | 8/2002 |
| JP | 2002-329567 A | 11/2002 |

(Continued)

OTHER PUBLICATIONS

U.S. Appl. No. 13/014,827, filed Jan. 27, 2011, Volfovski et al.
(Continued)

*Primary Examiner* — Jimmy Chou
(74) *Attorney, Agent, or Firm* — Moser Taboada; Alan Taboada

(57) ABSTRACT

Embodiments of substrate supports with a heater are provided herein. In some embodiments, a substrate support may include a first member to distribute heat to a substrate when present above a first surface of the first member; a heater coupled to the first member and having one or more heating zones to provide heat to the first member; a second member disposed beneath the first member; a tubular body disposed between the first and second members, wherein the tubular body forms a gap between the first and second members; and a plurality of substrate support pins disposed a first distance above the first surface of the first member, the plurality of substrate support pins to support a backside surface of a substrate when present on the substrate support.

20 Claims, 5 Drawing Sheets

(56) References Cited

U.S. PATENT DOCUMENTS

| | | | |
|---|---|---|---|
| 6,803,546 B1* | 10/2004 | Boas et al. | 219/390 |
| 6,815,646 B2* | 11/2004 | Ito et al. | 219/444.1 |
| 6,960,743 B2* | 11/2005 | Hiramatsu et al. | 219/444.1 |
| 7,024,105 B2* | 4/2006 | Fodor et al. | 392/418 |
| 7,211,153 B2* | 5/2007 | Kuibira | B32B 18/00 |
| | | | 118/725 |
| 7,361,865 B2* | 4/2008 | Maki et al. | 219/444.1 |
| 7,432,476 B2* | 10/2008 | Morita et al. | 219/444.1 |
| 7,467,901 B2* | 12/2008 | Kamei | 396/611 |
| 7,718,925 B2* | 5/2010 | Goto et al. | 219/390 |
| 7,815,740 B2* | 10/2010 | Oohashi et al. | 118/724 |
| 7,927,096 B2* | 4/2011 | Fukumoto et al. | 432/253 |
| 7,988,816 B2* | 8/2011 | Koshiishi et al. | 156/345.47 |
| 8,003,919 B2* | 8/2011 | Goto et al. | 219/390 |
| 8,222,574 B2* | 7/2012 | Sorabji et al. | 219/444.1 |
| 8,491,752 B2* | 7/2013 | Ueda et al. | 156/345.51 |
| 8,608,885 B2* | 12/2013 | Goto et al. | 156/85 |
| 2002/0036881 A1 | 3/2002 | Shamouilian et al. | |
| 2002/0129475 A1 | 9/2002 | Tsai et al. | |
| 2002/0158060 A1* | 10/2002 | Uchiyama et al. | 219/444.1 |
| 2002/0175160 A1* | 11/2002 | Bagley et al. | 219/390 |
| 2002/0186967 A1* | 12/2002 | Ramanan et al. | 392/418 |
| 2003/0015515 A1* | 1/2003 | Ito et al. | 219/444.1 |
| 2003/0015517 A1* | 1/2003 | Fure et al. | 219/444.1 |
| 2003/0052118 A1* | 3/2003 | Ramanan et al. | 219/444.1 |
| 2004/0011780 A1* | 1/2004 | Sun et al. | 219/444.1 |
| 2004/0040665 A1* | 3/2004 | Mizuno et al. | 156/345.51 |
| 2004/0117977 A1* | 6/2004 | Hiramatsu et al. | 29/611 |
| 2004/0168641 A1* | 9/2004 | Kuibira et al. | 118/728 |
| 2004/0226515 A1* | 11/2004 | Yendler et al. | 118/728 |
| 2005/0016471 A1* | 1/2005 | Chiang et al. | 118/728 |
| 2005/0099758 A1 | 5/2005 | Kellerman et al. | |
| 2005/0166848 A1* | 8/2005 | Natsuhara et al. | 118/728 |
| 2005/0173396 A1* | 8/2005 | Ooshima et al. | 219/390 |
| 2005/0217585 A1* | 10/2005 | Blomiley et al. | 118/728 |
| 2005/0219786 A1 | 10/2005 | Brown et al. | |
| 2005/0223994 A1* | 10/2005 | Blomiley | C23C 14/505 |
| | | | 118/725 |
| 2006/0096972 A1* | 5/2006 | Nakamura | 219/444.1 |
| 2006/0156987 A1* | 7/2006 | Lai et al. | 118/728 |
| 2006/0216665 A1* | 9/2006 | Fukuoka et al. | 432/4 |
| 2007/0044719 A1* | 3/2007 | Ku et al. | 118/728 |
| 2007/0079761 A1* | 4/2007 | Yendler | C23C 16/4586 |
| | | | 118/728 |
| 2007/0138601 A1 | 6/2007 | Fan et al. | |
| 2008/0006618 A1* | 1/2008 | Futakuchiya | H01L 21/67103 |
| | | | 219/444.1 |
| 2008/0041312 A1* | 2/2008 | Matsuyama et al. | 118/728 |
| 2008/0175999 A1* | 7/2008 | Kawaji et al. | 427/444 |
| 2008/0276869 A1* | 11/2008 | Bader et al. | 118/728 |
| 2008/0302781 A1* | 12/2008 | Murakami et al. | 219/444.1 |
| 2009/0007841 A1* | 1/2009 | Hirata et al. | 117/84 |
| 2009/0031955 A1* | 2/2009 | Lu et al. | 118/728 |
| 2009/0032522 A1* | 2/2009 | Salinas | H01L 21/67103 |
| | | | 219/446.1 |
| 2009/0078694 A1* | 3/2009 | Hayashi | 219/444.1 |

FOREIGN PATENT DOCUMENTS

| | | |
|---|---|---|
| JP | 2002-359281 A | 12/2002 |
| JP | 2009-117441 A | 5/2009 |
| KR | 10-2009-0101093 | 9/2009 |

OTHER PUBLICATIONS

International Search Report and Written Opinion dated Feb. 19, 2013 for PCT Application No. PCT/US2012/048781.

Search Report for Taiwan Invention Patent Application No. 101127756 dated Nov. 23, 2015.

Search Report from The State Intellectual Property Office of The People's Republic of China dated Oct. 13, 2015 received for China Application No. 2012800388389.

* cited by examiner

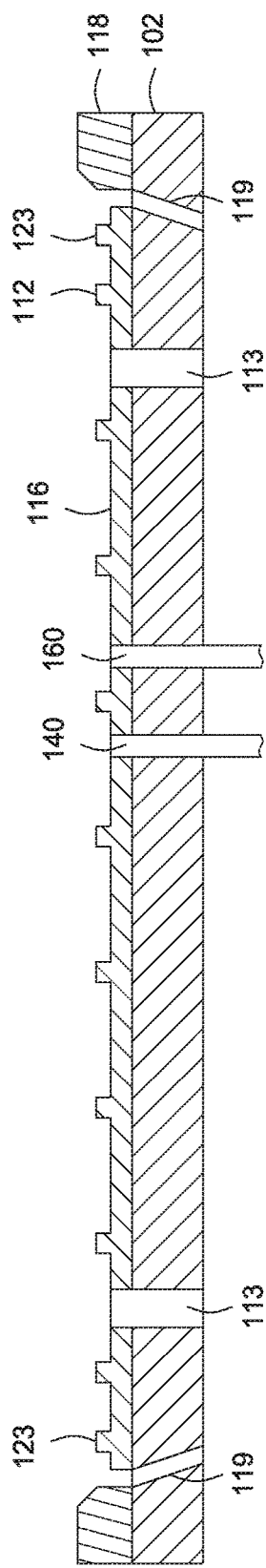
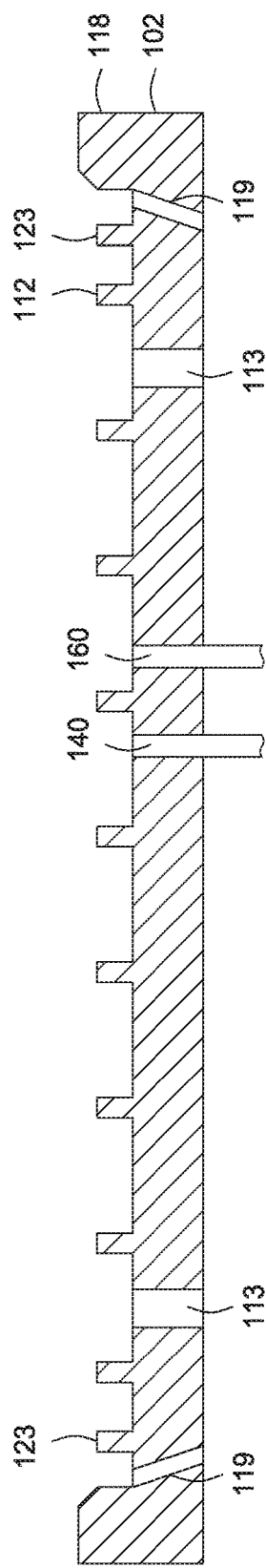
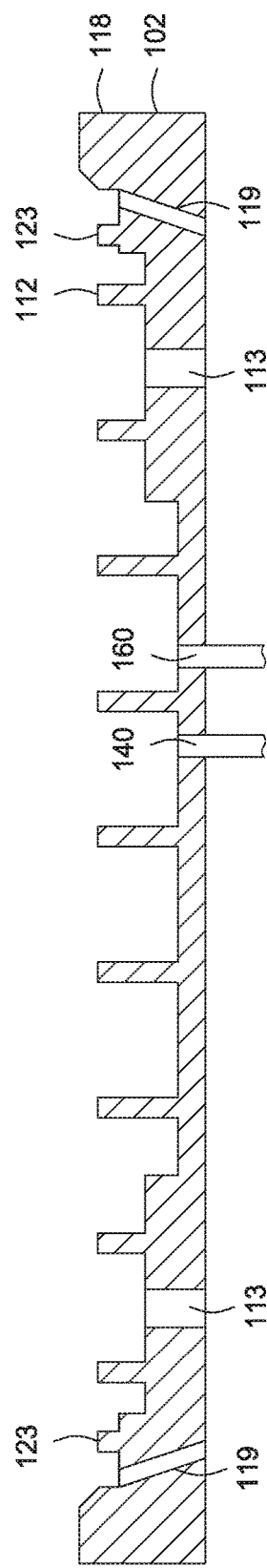

SUBSTRATE SUPPORT WITH HEATER

FIELD

Embodiments of the present invention generally relate to substrate processing equipment, and more specifically to a substrate support.

BACKGROUND

As the critical dimensions of devices continue to shrink, improved control over processes, such as heating, cooling, or the like may be required. For example, a substrate support may include a heater to provide a desired temperature of a substrate disposed on the substrate support during processing.

Thus, the inventors have provided an improved substrate support having a heater to facilitate control of the temperature of a substrate.

SUMMARY

Embodiments of substrate supports with a heater are provided herein. In some embodiments, a substrate support may include a first member to distribute heat to a substrate when present above a first surface of the first member; a heater coupled to the first member and having one or more heating zones to provide heat to the first member; a second member disposed beneath the first member; a tubular body disposed between the first and second members, wherein the tubular body forms a gap between the first and second members; and a plurality of substrate support pins disposed a first distance above the first surface of the first member, the plurality of substrate support pins to support a backside surface of a substrate when present on the substrate support.

In some embodiments, a substrate support may include a first member to distribute heat to a substrate when present above a first surface of the first member; a plurality of substrate support pins extending from the first surface of the first member to support a backside surface of a substrate when present on the substrate support; one or more resistive heating elements disposed in the first member; a second member disposed below the first member; and a tubular body disposed between the first and second members and forming a gap between a lower surface of the first member and an upper surface of the second member.

In some embodiments, a substrate support may include a first member to distribute heat to a substrate when present above an upper surface of the first member; a plurality of substrate support pins extend from a surface of the first member to support a backside surface of a substrate when present on the substrate support; one or more heating zones each having one or more resistive heating elements, wherein the one or more heating zones are disposed on a lower surface of the first member; a second member disposed below the first member; and a tubular body disposed between the first and second members and forming a gap between the lower surface of the first member and an upper surface of the second member.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIGS. 2A-C depict cross-sectional side views of portions of substrate supports in accordance with some embodiments of the present invention.

Figure 1:
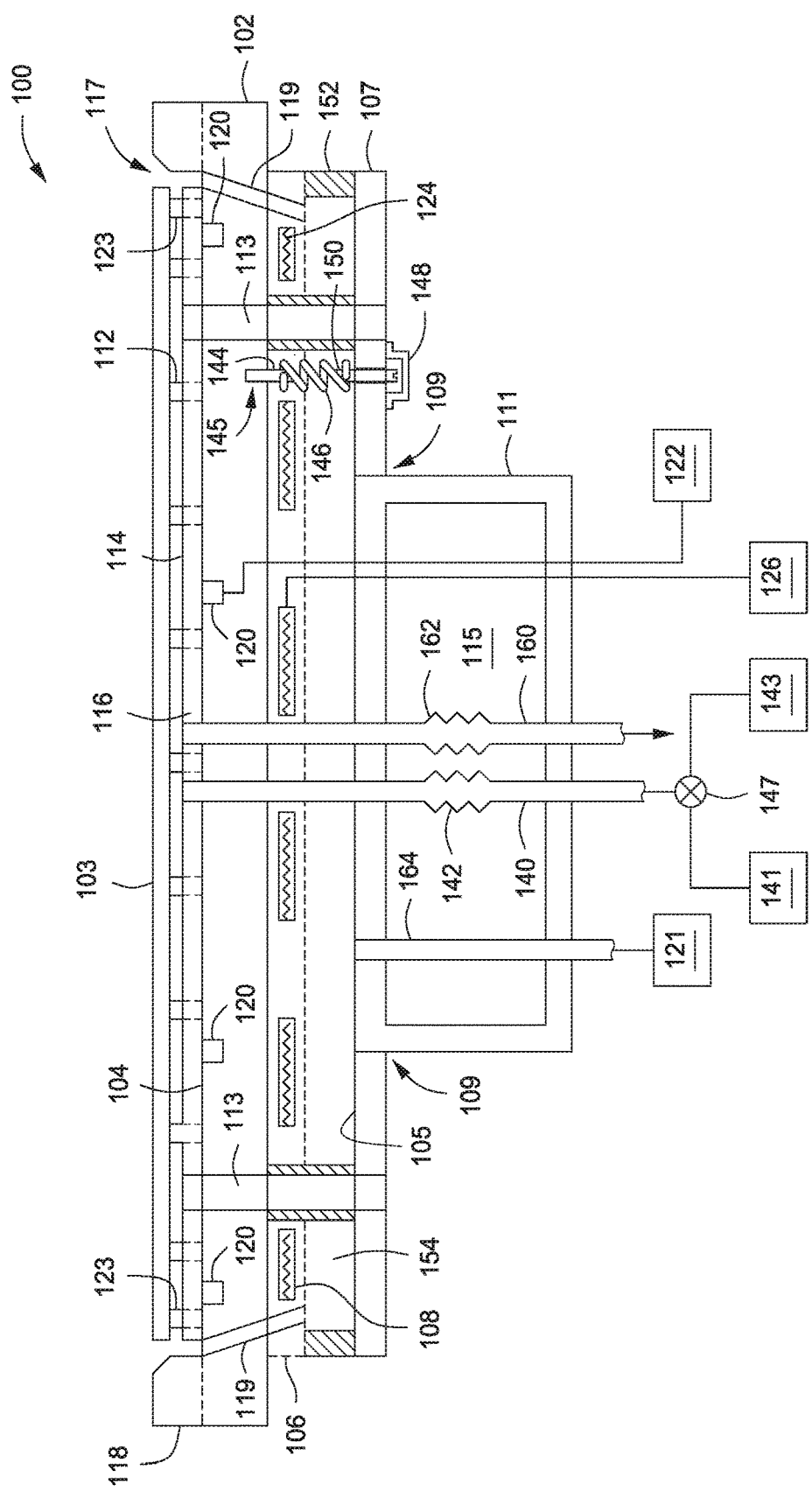
FIG. 1 depicts a schematic side view of a substrate support in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of substrate supports having a heater are disclosed herein. The inventive substrate support may advantageously facilitate one or more of heating a substrate, maintaining the temperature of a substrate, or distributing heat to a substrate in a desired profile.

Figure 3A:
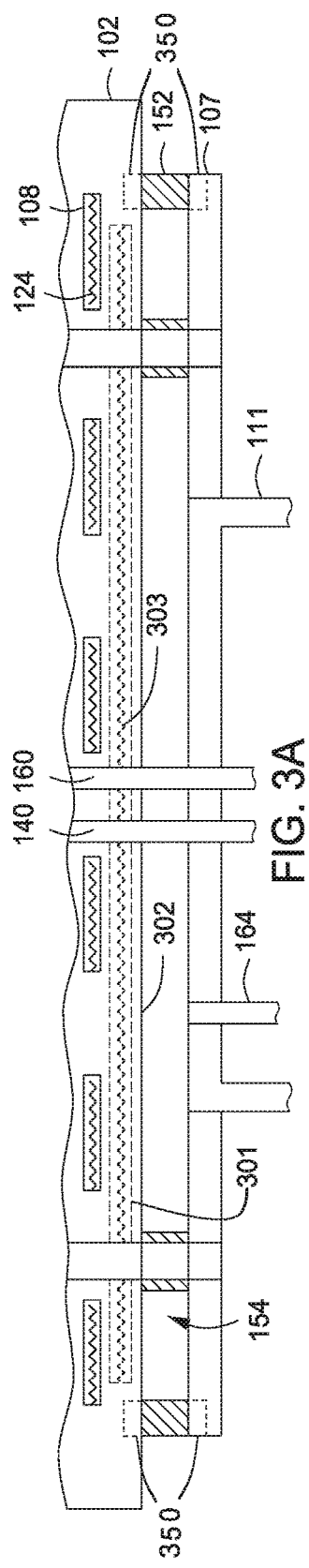
FIGS. 3A-C depict cross-sectional side views of portions of substrate supports in accordance with some embodiments of the present invention.
Figure 3B:
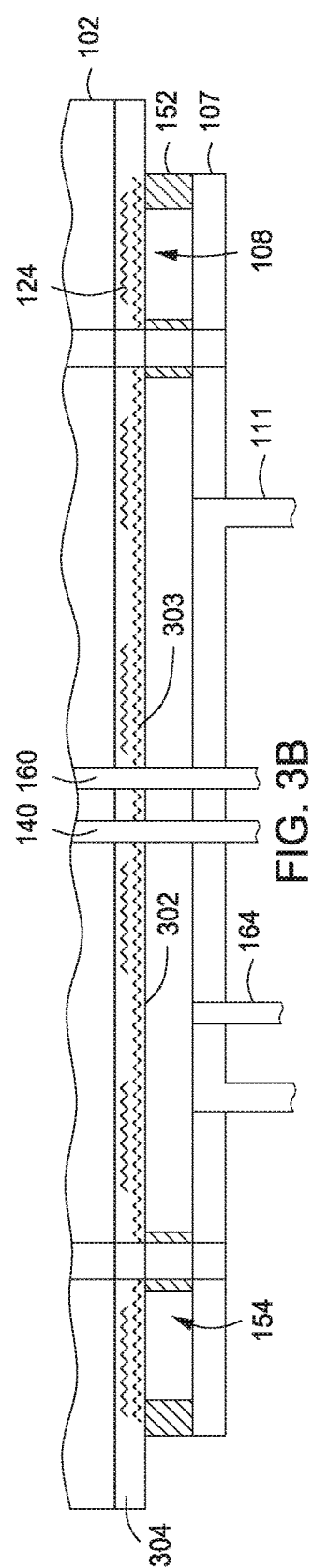

FIG. 1 depicts a substrate support 100 in accordance with some embodiments of the present invention. The substrate support 100 may include a first member 102 to distribute heat to a substrate 103 when present above a first surface 104 (e.g., an upper surface) of the first member 102 and a heater 106 having one or more heating zones 108 to provide heat to the first member 102. Optionally, the heater 106 may further include a second heating zone 301 (as illustrated in FIGS. 3A-B) which underlies and spans the one or more heating zones 108. The second heating zone 301 may be utilized to achieve a base temperature across the first member 102 and the one or more heating zones 108 may be utilized for fine adjustment of the temperature in each location of the first member 102, for example, to achieve a uniform distribution of temperature on the substrate 103 or to achieve a desired non-uniform distribution of temperature on the substrate 103. As shown in FIG. 1, the heater 106 can be disposed below the first member 102. However, this is merely one exemplary embodiment of the heater 106. The heater 106 may be disposed in the first member 102, on a surface of the first member 102, or below the first member 102. Embodiments of the heater 106 are discussed with respect to FIGS. 3A-B, below.

In some embodiments, the substrate support may provide temperatures ranging from about 450 degrees Celsius to about 600 degrees Celsius. However, embodiments of the substrate support disclosed herein are not limited to the above-mentioned temperature range. For example, the temperature may be lower, such as from about 150 degrees Celsius to about 450 degrees Celsius, or higher, such as greater than about 600 degrees Celsius.

The substrate support 100 may include a second member 107 disposed beneath the first member 102. The second member 107 may function as a facilities management plate, such as for wire and/or piping management to the one or more heating zones 108 or the like. In some embodiments, the second member 107 may serve as a thermal insulator, preventing convective losses to environment below. For example, when used as a thermal insulator, the second member 107 may comprise a thermally resistive material, such as MACOR® or any suitable thermally resistive material, such as a ceramic material or the like.

The second member 107 may include an opening 109, for example, centrally disposed through the second member 107. The opening 109 may be utilized to couple a feedthrough assembly 111 to the members 102, 107 of the substrate support 100. The feedthrough assembly 111 may feed various sources and/or control devices, such as a power source 126 to the one or more heating zones 108, or a controller 122 as discussed below. In some embodiments, the feedthrough assembly 111 may include a conduit 140 which can at least one of provide a gas from a gas source 141 to the backside of the substrate 103 or provide a vacuum from a vacuum pump 143 to secure the substrate 103 to the substrate support 100. For example, the vacuum or gas may be alternately provided by a multi-way valve 147 coupling the vacuum pump 143 and gas source 141 to the conduit 140. For example, the gas provided by the conduit 140 may be utilized to improve heat transfer between the first member 102 and the substrate 103. In some embodiments, the gas is helium (He). For example, in operation, the vacuum pump 143 may be used to secure the substrate 103 to the substrate support 100. After the substrate 103 is secured, the gas source 141 may provide a gas to the space between the substrate 103 and the first member 102 to improve heat transfer.

The conduit 140 may include a flexible section 142, such as a bellows or the like. Such flexibility in the conduit 140 may be helpful, for example, when the substrate support 100 is leveled, and/or during thermal deformation or expansion of the substrate support 100 during heating. For example, the substrate support 100 may be leveled by one or more leveling devices (not shown) disposed about the feedthrough assembly 111 and through one or more members of the substrate support 100. For example, such leveling devices may include kinematic jacks or the like. Further, the feedthrough assembly 111 may include a second conduit 160 having a flexible section 162 to exhaust the gas provided by the gas source 141 through the conduit 140 as illustrated in FIG. 1.

A tubular body 152 may be disposed between the first and second members 102, 107. The tubular body 152 and may be utilized to provide a gap 154 between the first and second members 102, 107 and/or to provide an additional space for electrical wires, fluid or gas conduits, or the like to be provided to components of the substrate support 100 disposed above. For example, in some embodiments, the gap 154 may be formed between a lower surface (e.g., a lower surface 302 as illustrated in FIG. 3A-B) of the first member 102 and an upper surface 105 of the second member 105. The gap 154 may be filled with a gas, such as air, helium (He) or the like. The gas may be used as a thermally resistive gas or a heat transfer gas. For example, the composition of the gas may be selected based on the desired temperature profiles required for processes being performed a processing system using the support 100. Thus, the gap 154 may be used to conduct heat from the one or more heating zones 108 coupled to the first layer 102 to the second member 107 by providing a gas that is a good thermal conductor. An exemplary gas for heat conduction may be helium (He). Alternatively, the gap 154 may be used to insulate the support 100 from heat loss, for example, by creating a vacuum in the gap 154. For example, the gap 154 may be coupled to a vacuum pump, such as the vacuum pump 141 (coupling not illustrated in FIG. 1) or another vacuum pump (not shown). The tubular body 152 may comprise stainless steel or the like. Further, the tubular body 152 may be fitted to the first and second members 102, 107 in any suitable manner, for example, such as disposed in recesses 350 about the peripheral edges of tubular body-facing surfaces of the first and second members 102, 107 or the like. Alternatively, the tubular member 152 may be a lip or protrusion extending from the first member 102 or the second member 107.

The feedthrough assembly 111 may include a volume 115. The volume 115 may be isolated from the gap 154 and have an atmosphere that may be independently controlled. For example, the volume 115 may be may be coupled to one or more of a gas source, such as the gas source 141 (coupling not illustrated in FIG. 1) or another gas source (not shown), or a vacuum pump, such as vacuum pump 143 (coupling not illustrated in FIG. 1) or another vacuum pump (not shown) to provide a gas and/or vacuum in the volume 115.

The feedthrough assembly 111 may include additional conduits for providing vacuum and/or gas to regions in the substrate support 100. For example, the feedthrough assembly may include a conduit 164 to provide one or more of a vacuum, or a gas to the gap 154. For example, the conduit 164 may include a flexible section (not shown) similar to other conduits mentioned above for similar reasoning. For example, the conduit 164 may be used to couple the gap 154 to one or more of a vacuum pump, such as the vacuum pump 143 (coupling not illustrated in FIG. 1) or another vacuum pump (not shown), or a gas source, such as the gas source 141 (coupling not illustrated in FIG. 1) and/or another gas source, for example, such as a purge gas source 121. For example, the purge gas source 121 may be used to provide a purge gas to limit the deposition of materials on the backside of the substrate 103 during processing. For example, the purge gas may be provided to the backside of the substrate 103 via one or more purge gas channels 119 disposed in the first member 102. As illustrated in FIG. 1, the one or more purge gas channels 119 may fluidly couple the purge gas provided by the conduit 164 to the gap 154 to a gap 117 disposed proximate the edge of the substrate 103. For example, as illustrated in FIG. 1, the gap 117 may be formed between an alignment guide 118 and the peripheral edge of the substrate 103 on the first surface 104 of the first member 102. The purge gas may include one or more of helium (He), nitrogen (N2), or any suitable inert gas. The purge gas may be exhausted via the gap 117 and may limit or prevent process gases from reaching and reacting with a backside of the substrate 103 during processing. The purge gas may be exhausted from the process chamber via the exhaust system of the process chamber (not shown) to appropriately handle the exhausted purge gas. Alternatively, (not shown) the one or more purge gas channels may be disposed through and about the alignment guide 118 to provide a purge gas to the gap 117.

The members of the substrate support 100 may be coupled together by any number of suitable mechanisms. For example, suitable mechanisms may include gravity, adhesives, bonding, brazing, molding, mechanical compression (such as by screws, springs, one or more clamps, vacuum, or the like), or the like. A non-limiting exemplary form of mechanical compression is illustrated in FIG. 1. For example, a compression assembly 145 may include a rod 144 disposed through one or several members of the substrate support 100 and used to compress first member 102 (and any members between the first and second members 102, 107) with the second member 107. The rod 144 is illustrated as a single piece, but may be multiple pieces (not shown) connected together by a hinge, ball and socket structure or the like to facilitate relative movement between the multiple pieces, if necessary. The rod 144 may provide flexibility for leveling the substrate support 100, similar to as discussed above for the conduit 140.

The rod 144 may be coupled to the first member 102 for example through brazing, welding, or the like, or the rod 144 may be threaded and screwed into a corresponding threaded opening in the first member 102 that is configured to receive the rod 144 (not shown). An opposing end of the rod 144 may be coupled to the second member 107 via a spring 146 or other suitable resilient structure. For example, a first end of the spring 146 may be coupled to the rod 144 and an opposing second end of the spring 146 may be coupled to the second member 107. As shown in FIG. 1, a bolt 150 disposed in the second member 107 is coupled to the second end of the spring 146. In some embodiments, a cover 148 may be provided over the bolt 150. Although the spring 146 is shown providing a compressive force to pull the rod 144 towards the second member 107, the rod 144 and spring 146 could also be configured to provide the desired coupling force by expansion of the spring 146. Although only one compression assembly 145 is illustrated in FIG. 1, a plurality of compression assemblies 145 may be provided, for example, disposed about a central axis of the support 100. In some embodiments, three compression assemblies 145 may be disposed symmetrically about the central axis of the support 100.

Figure 3C:
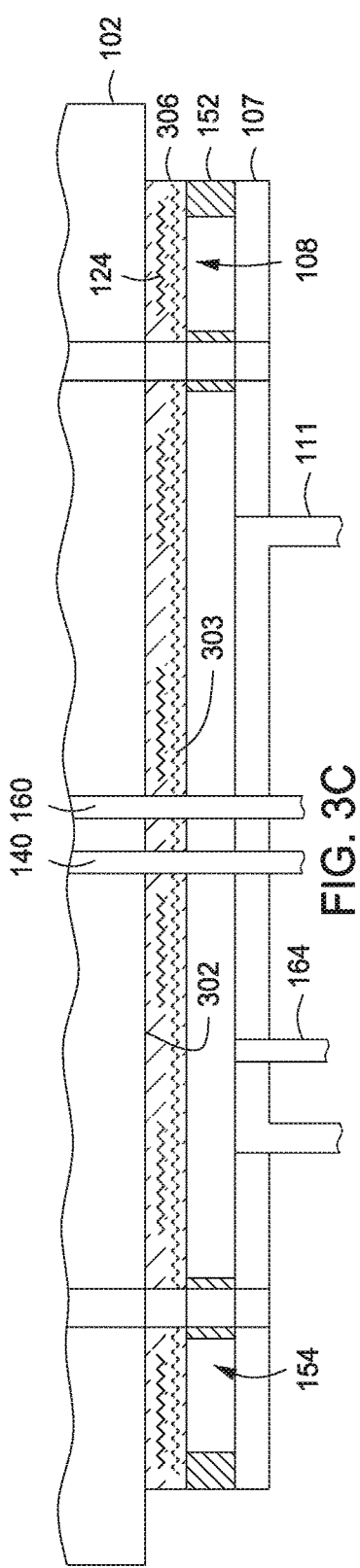
Figure 5:
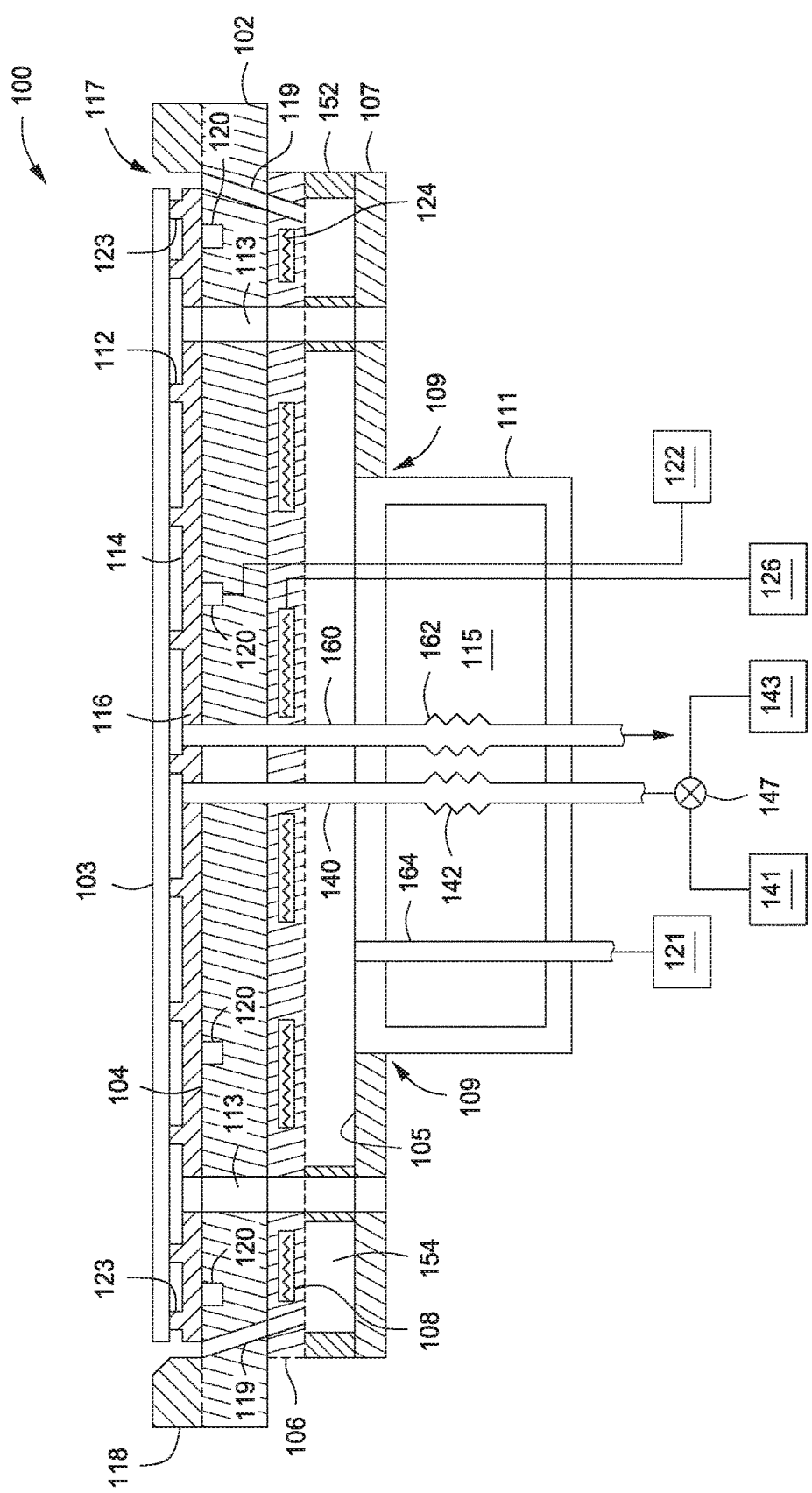
FIG. 5 depicts a schematic side view of a substrate support in accordance with some embodiments of the present invention.

Alternatively, the members of the substrate support 100 may be coupled together by sintering the members together. For example, sintering the members together may improve heat transfer between members. For example, an embodiment of the substrate support 100 having members sintered together is illustrated in FIG. 5. For example, as shown in FIG. 5, the compression assembly(s) 145 may be absent and the first member 102, the heater 106, the tubular body 152 and the second member 107 may be sintered together. For example, each member may be formed individually and then sintered to together. For example, the tubular body 152 and the second member 107 may be formed separated and then sintered together after formation. For example, in some embodiments, each member may be formed from aluminum nitride (AlN) or any suitable ceramic material. Further, although illustrated in FIG. 5 as structural member, the heater 106 may be any suitable embodiment of a heater as illustrated in FIGS. 3A-C and discussed below. Similarly, although the first member 102 may be illustrated in FIG. 5 to have aspects consistent with embodiments of the first member 102 as illustrated in FIG. 2A and discussed below, the first member 102 may be any suitable embodiment of a first member as illustrated in FIGS. 2A-C and discussed below.

In some embodiments, the substrate support 100 may include a plurality of substrate support pins 112 disposed a first distance above the first surface 104 of the first member 102, the plurality of substrate support pins 112 can support a backside surface of the substrate 103 when present on the substrate support. The plurality of substrate support pins 112 may be surrounded by a support ring 123. The support ring 123 may contact the backside of the substrate 103 proximate the peripheral edge of the substrate 103. For example, the support ring 123 may be used, for example, to define a space or volume between the backside of the substrate 103 and the substrate support 100. For example, the space may be used to form a vacuum for securing the substrate 103 to support 100 and/or to provide a gas for heat transfer between the support 100 and the substrate 103 as discussed above.

In some embodiments, (as illustrated by the dotted lines proximate each support pin 112 and the support ring 123) each of the plurality of substrate support pins and support ring 123 may extend from the first surface 104 of the first member 102 (e.g., the substrate support pins 112 and support ring 123 may be a part of, and formed in the first member 102). Alternatively, in some embodiments, a support layer 116 may be disposed on the first surface 104 of the first member 102 and each of the plurality of substrate support pins 112 and the support ring 123 may extend from a surface 114 of the support layer 116. In some embodiments, the support layer 116 and each of the plurality of substrate support pins 112 and the support ring 123 may be formed from the same material. For example, the support layer 116 and the each of the substrate support pins 112 and the support ring 123 may be a one-piece structure (illustrated in FIG. 2A and discussed below). The support layer and each of the plurality of substrate support pins 112 and the support ring 123 can be formed of suitable process-compatible materials having wear resistant properties. For example, materials may be compatible with the substrate, with processes to be performed on the substrate, or the like. In some embodiments, the support layer 116 and/or the substrate support pins 112 and/or the support ring 123 may be fabricated from a dielectric material. In some embodiments, the materials used to form the support layer 116 and/or the substrate support pins 112 and/or the support ring 123 may include one or more of a polyimide (such as KAPTON®), aluminum oxide ($Al_2O_3$), aluminum nitride (AlN), silicon dioxide ($SiO_2$), silicon nitride ($Si_3N_4$), silicon carbon (SiC) or the like. In some embodiments, for example for low temperature applications (e.g., at temperatures below about 200 degrees Celsius), the support layer 116 and/or the substrate support pins 112 and/or the support ring 123 may comprise KAPTON®.

In some embodiments, the substrate support 100 may include the alignment guide 118 extending from the first surface 104 of the first member 102 and about the plurality of substrate support pins 112. The alignment guide 118 may serve to guide, center, and/or align the substrate 103, such as with respect to the one or more heating zones 108 disposed below the substrate 103, for example, when the substrate is lowered onto the substrate support pins 112 by a plurality of lift pins (not shown—lift pins holes 113 are illustrated in FIG. 1 and may extend through support layer 116 and first and second member 102, 107). The lift pin holes 113 may be isolated from the gap 154, for example, by any suitable structure, such as tubes 125, which isolate the lift pin holes 113 from the gap 154. For example, the tubes 125 may prevent a gas provided to the gap 154 from reaching the backside of the substrate 103 via the lift pin holes 113.

The alignment guide 118 may be formed of suitable process compatible materials, such as materials having wear resistant properties and/or a low coefficient of thermal expansion. The alignment guide 118 may be a single piece or an assembly of multiple components. In some embodiments, the alignment guide 118 may be fabricated from a dielectric material. For example, suitable materials used to form the alignment guide 118 may include one or more of CELAZOLE® PBI (polybenzlmidazole), aluminum oxide ($Al_2O_3$), or the like. Generally, materials for any of the various components of the substrate support 100 may be selected based on chemical and thermal compatibility of the materials with each other and/or with a given process application.

The first member 102 may be utilized to distribute heat to the substrate 103. For example, the first member may act as a heat spreader to diffuse the heat provided by the one or more heating zones 108. In some embodiments, the first member 102 may include one or more temperature monitoring devices 120 embedded in the first member 102 or extending through the first member 102 to monitor the temperature being provided to the substrate 103 at one or more positions along the first surface 104 of the first member 102. The temperature monitoring devices 120 may include any suitable device for monitoring temperature, such as one or more of a temperature sensor, resistance temperature device (RTD), optical sensor, or the like. The one or more temperature monitoring devices 120 may be coupled to a controller 122 to receive temperature information from each of the plurality of the temperature monitoring devices 120. The controller 122 may further be used to control the heating zones 108 in response to the temperature information, as discussed further below. The first member 102 may be formed of suitable process-compatible materials, such as materials having one or more of high thermal conductivity, high rigidity, and a low coefficient of thermal expansion. In some embodiment, the first member 102 may have a thermal conductivity of at least about 140 W/mK. In some embodiment, the first member 102 may have a coefficient of thermal expansion of about $9 \times 10^{-6}/°$ C. or less. Examples of suitable materials used to form the first member 102 may include one or more of aluminum (Al), copper (Cu) or alloys thereof, aluminum nitride (AlN), beryllium oxide (BeO), pyrolytic boron nitride (PBN), silicon nitride ($Si_3N_4$), aluminum oxide ($Al_2O_3$), silicon carbide (SiC), graphite coated with PBN, AlN coated with yttria ($Y_2O_3$), or the like. Other suitable coating that may be utilized with the first member 102 include diamond like coatings (DLCs) or the like.

Variations of the first member 102, the plurality of substrate support pins 112, and the alignment guide 118 are possible. For example, such variations may depend on the process being performed on the substrate 103 and/or the composition of the substrate 103. For example, depending on temperature requirements for a given process, the first member 102 may be formed of a material having a specific thermal conductivity or the like; however, such a material may contaminate the substrate 103 if the backside of the substrate 103 is exposed to the first surface 104 of the first member 102. Accordingly, the support layer 116 may be utilized under such conditions and be formed of a different material than the first member 102, where the different material will not contaminate the substrate 103. Similarly, the alignment guide 118 may be formed of a different material than the first member 102 for a similar reason. For example, FIG. 2A depicts an embodiment of the substrate support 100 which includes the alignment guide 118, the support layer 116 and the plurality of support pins extending from the support layer 116, and the first member 102, wherein the alignment guide 118 and the support layer 116 and support pins 112 are formed from different materials than the first member 102.

Alternatively, depending on the process being performed on the substrate 103 and/or the composition of the substrate 103, the first member 102, the plurality of substrate support pins 112, and the alignment guide 118 may be formed of the same material as illustrated in FIG. 2B. For example, wherein the material of the first member is compatible with the process being performed on the substrate 103 and/or the composition of the substrate 103, then embodiments of the substrate support 100 as shown in FIG. 2B may be used. As the support layer 116 is integral with the first member 102 in FIG. 2B, a separate support layer 116 is not shown in FIG. 2B. However, the support layer 116 may be considered to be an upper portion of the first member 102.

Alternatively, depending on the process being performed on the substrate 103 and/or the composition of the substrate, the first member 102 may vary in thickness as illustrated in FIG. 2C. For example, the thickness variation along the first member 102 may facilitate a desired heating profile along the substrate 103 and/or compensate for non-uniformities in a process being performed on the frontside surface of the substrate 103, such as deposition, curing, baking, annealing, etching, and others. For example, in some embodiments, as illustrated in FIG. 2C, the first member 102 may increase in thickness from the center to an edge of the first member 102. However, the embodiments of FIG. 2C are merely illustrative, and the thickness of the first member 102 may be varied in any suitable manner to provide a desired heating profile along the substrate 103. As illustrated in FIG. 2C, when the thickness of the first member 102 is varied, the plurality of support pins 112 may have varying lengths to compensate for the thickness variation in the first member 102. As shown in FIG. 2C, each support pin 112 has a length such that it contacts a backside surface of the substrate 103 at about the same vertical height. The plurality of support pins 112 may be individually fashioned and coupled to the first member 102 as illustrated in FIG. 2C. Alternatively, (not shown) the plurality of support pins 112 may be integral with the first member 102, for example, similar to the embodiments of the support pins 112 shown in FIG. 2B.

Returning to FIG. 1, the heater 106 may include one or more resistive heating elements 124. For example, each of the one or more heating zones 108 includes one or more resistive heating elements 124. Although illustrated in FIGS. 1 and 3A-D as being uniformly distributed, the one or more heating zones 108 may be distributed in any suitable configuration that is desired to provide a desired temperature profile on the substrate 103. Each of the resistive heating elements 124 may be coupled to a power source 126. The power source 126 may provide any suitable type of power, such as direct current (DC) or alternating current (AC), which is compatible with the resistive heating elements 124. The power source 126 may be coupled to and controlled by the controller 122 or by another controller (not shown), such as a system controller for controlling a process chamber having the substrate support disposed therein, or the like. In some embodiments, the power source 126 may further include a power divider (not shown) that divides the power provided to the resistive heating elements 124 in each heating zone 108. For example, the power divider may act in response to one or more of the temperature monitoring devices 120 to selectively distribute power to the resistive heating elements 124 in specific heating zones 108. Alternatively, in some embodiments, multiple power sources may be provided for the resistive heating elements in each respective heater zone.

Figure 4:
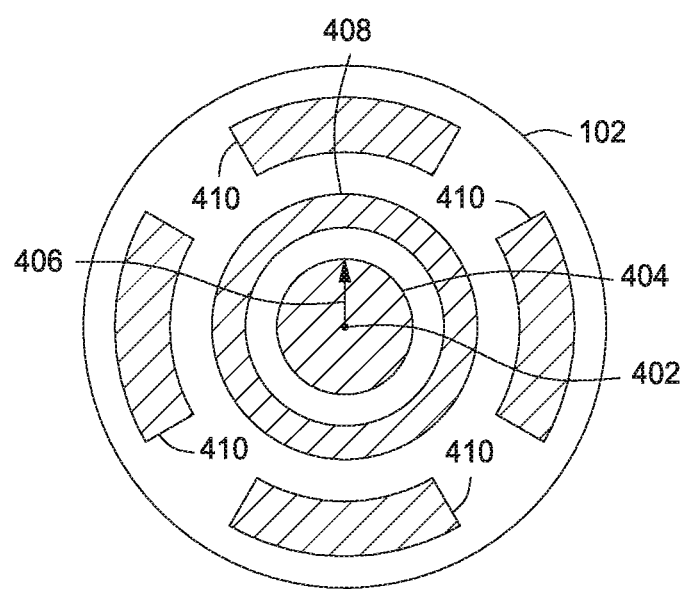
FIG. 4 depicts a top view of a multi-zone heater in accordance with some embodiments of the present invention.

For example, one embodiment of a configuration of the one or more heating zones 108 arranged into six zones is illustrated in FIG. 4, although greater or fewer zones may also be used. As shown in a top view, the heating zones 108 may be disposed about a central axis 402 of the substrate support 100. The one or more heating zones 108 may include a first heating zone 404 having a first radius 406 extending from the central axis 402 along the upper surface of the second member 107 (e.g., a central zone), a second heating zone 408 circumscribing the first heating zone 404 (e.g., a middle zone), and a third, fourth, fifth, and sixth heating zones 410 disposed about the second heating zone 408 (e.g., a plurality of outer zones). In some embodiments, and as shown, each of the four heating zones 410 may correspond to about one quarter of the outer region of the substrate support 100. In some embodiments, a temperature monitoring device (such as the temperature monitoring device 120 discussed above) may be provided to sense data corresponding to the temperature within each zone (or at a desired location within each zone). In some embodiments, each temperature monitoring device is an RTD. Each of the temperature monitoring devices may be coupled to the controller (such as controller 122 discussed above) to provide feedback control over each corresponding heating zone 108.

The compact design of the substrate support 100 and the tunability of heating to adjust for temperature non-uniformities on the substrate 103 can facilitate one or more of heating a substrate, maintaining the temperature of a substrate, uniformly distributing heat to or removing heat from a substrate, or create temperature non-uniformities on a substrate.

The heater 106 may be coupled to the first member 102 in any suitable manner, such as disposed in the first member 102, disposed on a surface of the first member 102, or disposed in a separate member which is coupled to the first member 102. For example, several non-limiting variations of the heater 106 are illustrated in the embodiments shown in FIGS. 3A-C. FIGS. 3A-C depict a partial cross sectional view of the support 100 in an accordance with some embodiments of the invention. For example, elements, such as the compression assembly 145, the temperature monitoring device 120, support pins 112, support layer 116 or other elements of the support illustrated in FIGS. 1 and 2A-B have been omitted, but may be used in accordance with any of the embodiments of the heater 106 illustrated in FIGS. 3A-C and described below.

For example, as shown in FIG. 3A, the heater 106 may be disposed in the first member 102. For example, the one or more resistive elements 124 may be disposed in the first member 102 in any suitable manner, such as arranged in heating zones 108, to provide a desired temperature profile to the substrate 103. For example, the one or more resistive elements 124 may be disposed at any suitable distance from a lower surface 302 of the first member 102 to provide the desired temperature profile. Although the heating zones 108 are illustrated as being disposed at the same distance from the lower surface 302 in FIG. 3A, the distance from the lower surface 302 may vary for one or more of the heating zones 108. Optionally, as discussed above, the heater 106 may include a second heat zone 301 which may be utilized to achieve a base temperature across the first member 102. The second heat zone 301 may include one or more resistive elements 303, which may be uniformly dispersed throughout the second heat zone 301. Although draw as a single resistive element in FIGS. 3A-C, the element 303 may be one or more resistive elements 303.

In some embodiments, the heater 106 may include the one or more resistive heating elements 124 deposited onto the lower surface 302 of the first member 102. For example, deposition may include any suitable deposition technique for forming a desired pattern of heating zones 108. For example, the one or more resistive heating elements 124 may comprise platinum, nichrome, INCONEL®, resistive ceramics or other suitable resistive heating materials. In some embodiments, after the deposition of the one or more resistive heating elements 124 is complete, a coating 304 may be used to cover the one or more heating elements disposed on the lower surface 302. For example, the coating 304 may cover the entire lower surface 302 as illustrated in FIG. 3B, or be limited to covering the one or more heating elements 124. The coating 304 may comprise an insulating material, such as a glass, ceramic, or the like. Optionally, prior to depositing the coating 304, the one or more resistive elements 303 may also be deposited below the one or more resistive heating elements 124. For example, the one or more resistive elements 124 and the one or more resistive elements 303 may be separated by an insulating layer (not shown) such as a dielectric layer or the like, which can be deposited prior to depositing the one or more resistive elements 303. Alternatively, the coating 304 may be deposited to cover the one or more resistive elements 124, and then the one or more resistive elements 303 may be deposited atop the coating 304. A second coating (not shown) may be deposited to cover the one or more resistive elements 303.

In some embodiments, as illustrated in FIG. 3C, the support 100 may include a third member 306 disposed beneath the first member 102 and above the tubular body 152. The heater 106 may include the one or more resistive heating elements 124 disposed in the third member 306. For example, deposition may include any suitable deposition technique for forming a desired pattern of heating zones 108. For example, and similar to the embodiments of FIG. 3A, the one or more resistive elements 124—and optionally, the one or more resistive elements 303—may be disposed in the third member 306 in any suitable manner, such as arranged in heating zones 108, to provide a desired temperature profile to the substrate 103. Alternatively, the third member 306 may comprise two members (not shown), for example, a first member including the one or more resistive heating elements 124 and a second member including the one or more resistive heating elements 303. For example, the one or more resistive elements 124 may be disposed at any suitable distance from a lower surface 302 of the first member 102 to provide the desired temperature profile. Although the heating zones 108 are illustrated as being disposed at the same distance from the lower surface 302 in FIG. 3C, the distance from the lower surface 302 may vary for one or more of the heating zones 108. The third member 306 may be formed of suitable process-compatible materials, such as materials having one or more of high mechanical strength (e.g., Bending strength at least about 200 MPa), high electrical resistivity (e.g., at least about $10^{14}$ ohm-cm), a low coefficient of thermal expansion (e.g., no more than about $5 \times 10^{-6 \circ}$ C.). Suitable materials may include one or more of silicon carbon (SiC), silicon nitride ($Si_3N_4$), aluminum nitride (AlN), aluminum oxide ($Al_2O_3$), beryllium oxide (BeO), pyrolytic boron nitride (PBN), graphite coated with PBN, AlN coated with yttria ($Y_2O_3$), or the like. Other suitable coating that may be utilized with the third member 306 may include diamond like coatings (DLCs) or the like Thus, embodiments of substrate supports have been disclosed herein. The inventive substrate support may advantageously facilitate one or more of heating a substrate, maintaining the temperature of a substrate, or uniformly distributing heat to or removing heat from a substrate, or create temperature non-uniformities on a substrate.

While the foregoing is directed to embodiments of the present invention, other and further embodiments of the invention may be devised without departing from the basic scope thereof.

The invention claimed is:

1. A substrate support, comprising:
a first member to distribute heat to a substrate when present above a first surface of the first member;
a heater comprising a layer that is coupled to and substantially covers a bottom surface of the first member, the heater having one or more heating zones to provide heat to the first member;
a second member disposed beneath the first member;
a tubular body disposed between the heater and the second member, wherein the tubular body forms a gap between the first and second members and wherein the tubular body is in direct contact with the heater;
a plurality of substrate support pins disposed a first distance above the first surface of the first member, the plurality of substrate support pins to support a backside surface of a substrate when present on the substrate support;
one or more purge gas channels disposed in the first member fluidly coupling the gap to the first surface in a region disposed radially outward of any substrate support pin on the first surface of the first member, the one or more purge gas channels extending radially inward to the gap from the region disposed radially outward of any substrate support pin;
a plurality of lift pin holes formed into the first member, the heater, and the second member; and
a plurality of tubes disposed in the gap corresponding to and aligned with the plurality of lift pin holes to isolate the plurality of lift pin holes from the gap, the plurality of tubes disposed between the heater and the second member, wherein the plurality of tubes is in direct contact with the heater.

2. The substrate support of claim 1, further comprising:
an alignment guide extending from the first surface of the first member and disposed about the plurality of substrate support pins.

3. The substrate support of claim 2, wherein each of the plurality of substrate support pins extends from the first surface of the first member.

4. The substrate support of claim 1, further comprising:
a support layer disposed on the first surface of the first member, wherein each of the plurality of substrate support pins extend from a surface of the support layer.

5. The substrate support of claim 1, wherein the heater further comprises:
a plurality of heating zones having a plurality of resistive heating elements, wherein the plurality of heating zones comprises one or more of the plurality of resistive heating elements.

6. The substrate support of claim 5, further comprising:
a third member disposed beneath the first member and above the tubular body, wherein each of the plurality of resistive heating elements are disposed in the third member.

7. The substrate support of claim 5, wherein each of the plurality of resistive heating elements are disposed in the first member.

8. The substrate support of claim 5, wherein each of the plurality of resistive heating elements is disposed on a lower surface of the first member, and further comprising:
a coating comprising an insulating material and covering the plurality of resistive heating elements disposed on the lower surface of the first member.

9. The substrate support of claim 1, further comprising:
a feedthrough assembly coupled to an opening in the second member, wherein the feedthrough assembly defines an interior volume that is isolated from and excludes the gap and wherein an atmosphere of the interior volume is independently controllable with respect to an atmosphere of the gap, wherein the feedthrough assembly includes a conduit extending through the interior volume and coupled to the gap.

10. The substrate support of claim 1, wherein the first member and the second member are sintered to the tubular body.

11. A substrate support, comprising:
a first member to distribute heat to a substrate when present above a first surface of the first member, the first surface of the first member having a substantially flat upper surface separated from the substrate;
a plurality of substrate support pins extending from the first surface of the first member to support a backside surface of a substrate when present on the substrate support and that partially define a volume between the first surface and the backside surface of the substrate when present;
one or more resistive heating elements disposed in the first member;
a second member disposed below the first member;
a tubular body disposed between the first member and the second member and forming a gap between a lower surface of the first member and an upper surface of the second member, the tubular body directly engaging in recesses about peripheral edges of tubular body facing surfaces of the first member and the second member;
a conduit extending through the first member, the second member, and the gap to supply or remove a gas to or from the volume while remaining isolated from the gap; and
a support ring surrounding the plurality of substrate support pins that, together with the plurality of substrate support pins, defines the volume between the first surface of the first member and the backside surface of the substrate when present, wherein the volume is fluidly isolated from the gap by the substrate when the substrate is disposed on the support ring.

12. The substrate support of claim 11, further comprising:
an alignment guide extending from the first surface of the first member and about the plurality of substrate support pins.

13. The substrate support of claim 11, wherein the one or more resistive heating elements comprise a plurality of resistive heating elements, and wherein the plurality of resistive heating elements are arranged into one or more heating zones.

14. The substrate support of claim 11, further comprising:
a feedthrough assembly coupled to an opening in the second member, wherein the feedthrough assembly defines an interior volume that is separated from and excludes the gap and wherein an atmosphere of the interior volume is independently controllable with respect to an atmosphere of the gap, wherein the feedthrough assembly includes a conduit extending through the interior volume and coupled to the gap.

15. The substrate support of claim 11, wherein the first member and the second member are sintered to the tubular body.

16. The substrate support of claim 1, further comprising:
a conduit extending through the first member, the second member, and the gap to supply or remove a gas to or from a volume disposed between the first surface and the backside surface of the substrate, when present.

17. The substrate support of claim 5, wherein the heater further comprises:
one of the one or more heating zones comprising at least one resistive heating element, wherein the one of the one or more heating zones underlies and spans the plurality of heating zones.

18. The substrate support of claim 11, further comprising:
one or more purge gas channels disposed through the first member radially outward of the plurality of substrate support pins and fluidly coupling the gap to a second gap disposed in a region proximate to an edge of the substrate, when present, the one or more purge gas channels extending radially inward to the gap from the second gap disposed in the region proximate to the edge of the substrate.

19. The substrate support of claim 11, further comprising:
one or more second resistive heating elements disposed in the first member and that underlie and span the one or more resistive heating elements.

20. A substrate support, comprising:
a first member to distribute heat to a substrate when present above a first surface of the first member;
a heater comprising a layer that is coupled to and substantially covers a bottom surface of the first member, the heater having one or more heating zones to provide heat to the first member;
at least one temperature monitoring device embedded in and aligned with the first surface of the first member;
a second member disposed beneath the first member;
a tubular body disposed between the heater and the second member, wherein the tubular body includes a sidewall forming a gap between the first member and the second member, wherein the tubular body is in direct contact with the heater;
a plurality of substrate support pins disposed a first distance above the first surface of the first member to support a backside surface of the substrate when present on the substrate support;
a plurality of tubes disposed in the gap to isolate the plurality of substrate support pins from the gap, the plurality of tubes disposed between the heater and the second member, wherein the plurality of tubes is in direct contact with the heater; and
a support ring surrounding the plurality of substrate support pins that defines a volume between the first surface of the first member and the backside surface of the substrate when present, wherein the volume is fluidly isolated from the gap by the substrate when the substrate is disposed on the support ring.

* * * * *